United States Patent
Chida et al.

(10) Patent No.: US 6,774,714 B2
(45) Date of Patent: Aug. 10, 2004

(54) SEMICONDUCTOR DEVICE PROVIDED WITH NOISE CUT FILTER

(75) Inventors: Tsuyoshi Chida, Tokyo (JP); Yasuhiro Hegi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 09/974,892

(22) Filed: Oct. 12, 2001

(65) Prior Publication Data

US 2002/0044010 A1 Apr. 18, 2002

(30) Foreign Application Priority Data

Oct. 13, 2000 (JP) ........................................ 2000-313892

(51) Int. Cl.[7] ................................................. H03K 5/00
(52) U.S. Cl. ........................ 327/558; 327/311; 333/172
(58) Field of Search ................................ 327/551, 552, 327/558, 311, 559; 333/172

(56) References Cited

U.S. PATENT DOCUMENTS

| | | | | |
|---|---|---|---|---|
| 5,055,669 A | * | 10/1991 | Blake et al. | 307/311 |
| 5,324,999 A | * | 6/1994 | Hunley et al. | 327/552 |
| 6,043,724 A | * | 3/2000 | Frech et al. | 331/181 |
| 6,340,913 B1 | * | 1/2002 | Grundy | 327/552 |
| 6,657,484 B1 | * | 12/2003 | Bosshart | 327/558 |

FOREIGN PATENT DOCUMENTS

JP 9-45855 2/1997

* cited by examiner

*Primary Examiner*—Dinh T. Le
(74) *Attorney, Agent, or Firm*—Oblon, Spivak, McClelland, Maier & Neustadt, P.C.

(57) ABSTRACT

A functional circuit and a filter are disposed between a first power supply wire capable of being set in a first electric potential of a semiconductor device and a second power supply wire capable of being set in a second electric potential, which is different from the first electric potential. The functional circuit is connected to the first power supply wire or the second power supply wire. Then, the filter transmits a signal inputted or outputted between the outside of the semiconductor device and the functional circuit.

16 Claims, 11 Drawing Sheets

FIG.12

| FUNCTION | CAPABILITY | EMS COUNTERMEASURE | |
| --- | --- | --- | --- |
| | | PROVIDED | NOT PROVIDED |
| BUFFER | LARGE | BUFFER 1 | BUFFER 11 |
| | MIDDLE | BUFFER 2 | BUFFER 12 |
| | SMALL | BUFFER 3 | BUFFER 13 |
| NOT | LARGE | NOT 1 | NOT 11 |
| | SMALL | NOT 2 | NOT 12 |
| FUNCTION A | | CELL A1 | CELL A11 |
| FUNCTION B | | BLOCK B1 | BLOCK B11 |
| FUNCTION C | | BLOCK C1 | BLOCK C11 |

93 — 94 — 95

SEMICONDUCTOR DEVICE PROVIDED WITH NOISE CUT FILTER

CROSS REFERENCE TO RELATED APPLICATIONS

This application is based upon and claims the benefit of priority from the prior Japanese Patent Applications No. P2000-313892, filed on Oct. 13, 2000; the entire contents of which are incorporated herein by reference.

BACKGROUND OF THE INVENTION

1. Field of the Invention

The present invention relates to a semiconductor device using a standard cell. Alternatively, the present invention relates to a semiconductor device provided with a noise cut filter for an Electromagnetic Susceptibility (EMS) countermeasure.

2. Description of the Related Art

There have been cases where malfunction occurs in semiconductor device such as a LSI or the like owing to external invasion of EMS. Therefore, in order to prevent malfunction, a countermeasure of EMS is provided to semiconductor device such as an LSI or the like. The EMS denotes a malfunction occurring in a cell C such as a buffer 11 owing to disturbance noise, which invaded from the input pad A of the LSI. As shown in FIG. 1, according to an EMS countermeasure of the LSI, a noise cut filter B is connected between pad A and cell C. The noise cut filter B has a resistance R11 and a capacitor C11, which are connected in series.

In the case that a filter B for an EMS countermeasure is arranged and wired in a specific cell, the architecture of cell base LSI using a conventional cell is as follows.

As shown in FIG. 1, logic cells 100 to 108 and a logic cell C are aligned in the cell base architecture area by automatic arrangement and automatic wiring and wires 65, 66 and 67 are wired in the logic cells 100 to 108 and the logic cell C. Next, an architect himself or herself searches for a specific cell C to be provided with the EMS countermeasure and the architect manually arranges and wires a filter B as an EMS countermeasure in an empty space in the metal signal wiring areas 41, 43 and 45. Alternatively, VDD power supply wires VDD1, VDD2 and VSS power supply wires VSS1, VSS2 are disposed between the cells 100 to 108 and between the signal wiring areas 41, 43 and 45. Wiring areas 42, 44 and 46 have the signal wiring areas 41, 43 and 45, the VDD power supply wires VDD1, VDD2 and the VSS power supply wires VSS1, VSS2. Thus, according to an earlier architecture method, manual work operation by the architect is inevitable, and the architecture and operating efficiency is very low.

SUMMARY OF THE INVENTION

A semiconductor integrated circuit according to embodiments of the present invention includes a first power supply wire capable of being set in a first electric potential, a second power supply wire capable of being set in a second electric potential, which is different from the foregoing first electric potential, a functional circuit, which is disposed between the foregoing first power supply wire and the foregoing second power supply wire, is connected to the foregoing first power supply wire or the foregoing second power supply wire and has a terminal, capable of inputting or outputting a signal with respect to the outside of the foregoing semiconductor integrated circuit, and a first capacitor disposed between the foregoing first power supply wire and the foregoing second power supply wire and one end of which is connected to the foregoing terminal.

A manufacturing method of a semiconductor device according to embodiments of the present invention includes a deciding a specification of the semiconductor device; a describing the decided specification in a logical expression; a forming a network list having a cell where an EMS countermeasure circuit is incorporated on the basis of the logical expression; a forming a layout pattern of the semiconductor device on the basis of the network list; and a processing a semiconductor substrate on the basis of the formed layout pattern to manufacture the semiconductor device.

BRIEF DESCRIPTION OF THE DRAWINGS

FIG. 12 is a data configuration of a standard cell library according to the first embodiment;

DESCRIPTION OF THE EMBODIMENTS

Figure 1:
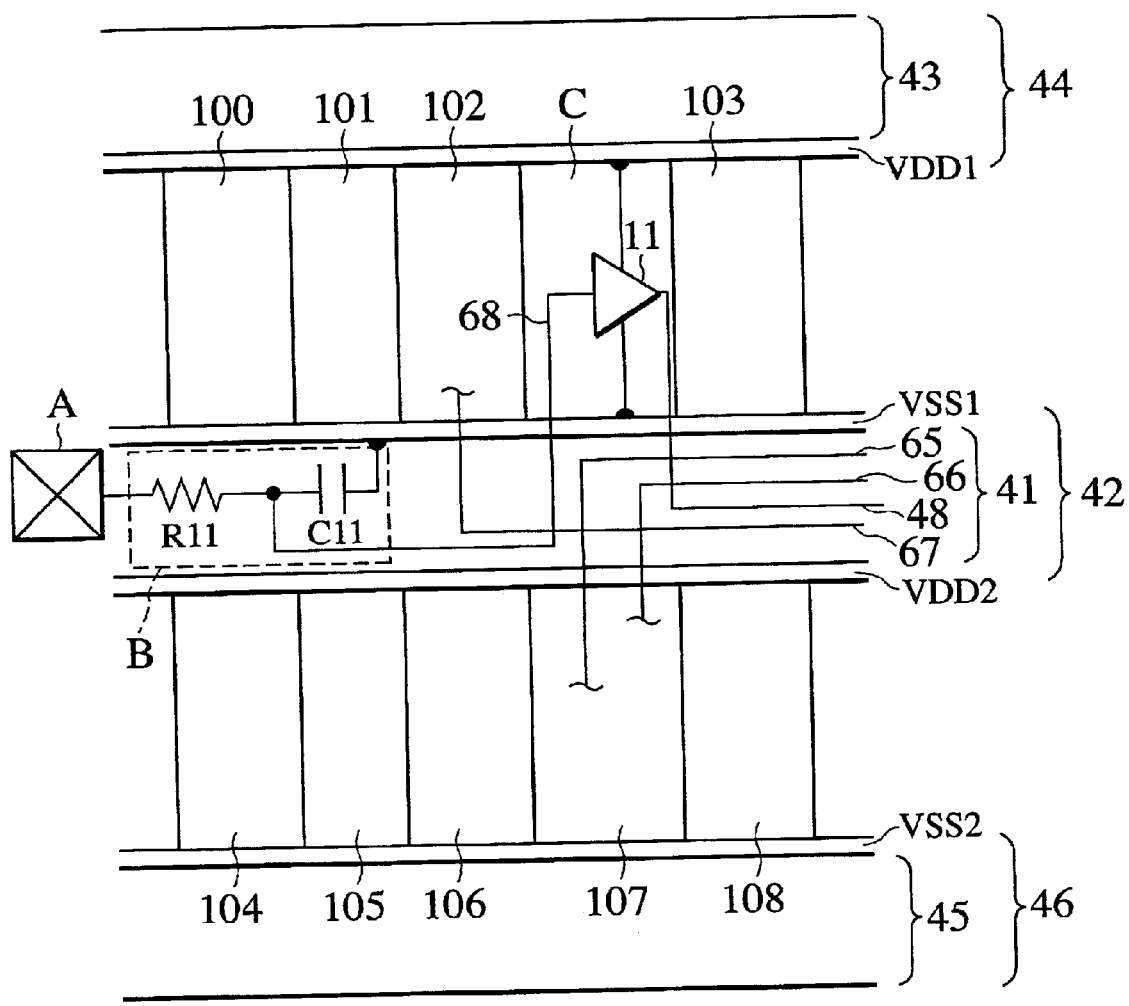
FIG. 1 is a diagram for illustrating a noise cut filter for an EMS countermeasure, which is arranged in a wiring area, according to an earlier semiconductor device.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Embodiment 1

Semiconductor Device

Figure 2:
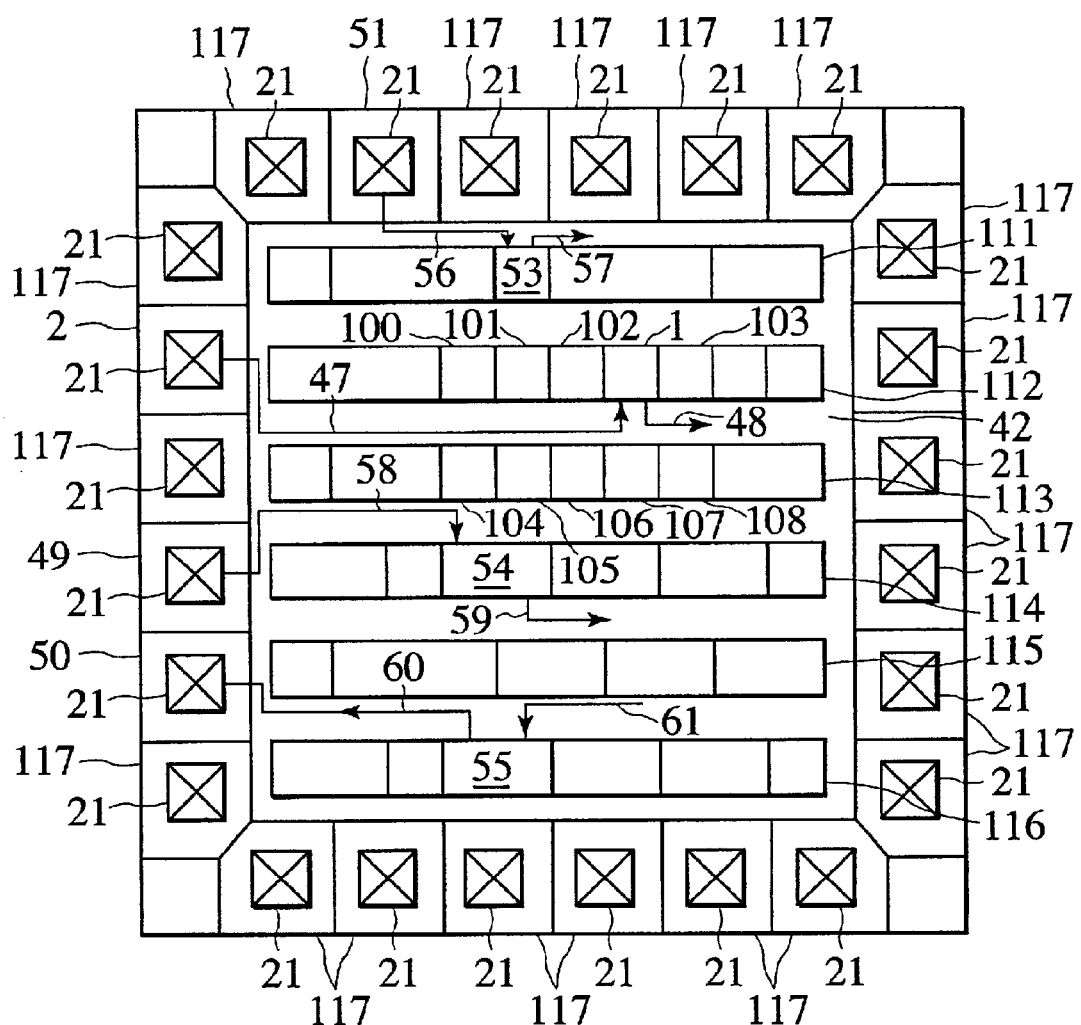
FIG. 2 is a top view of a semiconductor device according to a first embodiment.

According to a first embodiment, a semiconductor device, which is configured by a plurality of standard cells, will be explained. As shown in FIG. 2, in the semiconductor device according to the first embodiment, I/O cells 117, 51, 2, 49 and 50 are arranged on its peripheral portion. Within the semiconductor device, cell rows 111 to 116 having equal widths to each other are disposed in parallel with each other. A wiring area 42 is provided on the outside of the cell rows 111 to 116, being enclosed by the I/O cells 117, 51, 2, 49 and 50. The cell rows 111 to 116 are configured by a plurality of standard cells 1, 53 to 55 and 100 to 108 having equal widths, which are the same as the widths of the cell rows 111 to 116. The I/O cells 117, 51, 2, 49 and 50 have I/O pad 21.

A signal wire 47 is connected to the I/O pad 21 of the I/O cell 2 and the cell 1. The signal wire 48 is connected to the cell 1. The signal wires 47 and 48 are arranged in the wiring area 42. In the same way, a signal wire 56 is connected to the I/O pad 21 of the I/O cell 51 and the cell 53. A signal wire 57 is connected to the cell 53. The signal wires 56 and 57 are disposed in the wiring area 42. A signal wire 58 is connected to the I/O pad 21 of the I/O cell 49 and the cell 54. A signal wire 59 is connected to the cell 54. The signal wires 58 and 59 are arranged in the wiring area 42. A signal wire 60 is connected to the I/O pad 21 of the I/O cell 50 and the cell 55. A signal wire 61 is connected to the cell 55. The signal wires 60 and 61 are arranged in the wiring area 42.

Figure 3:
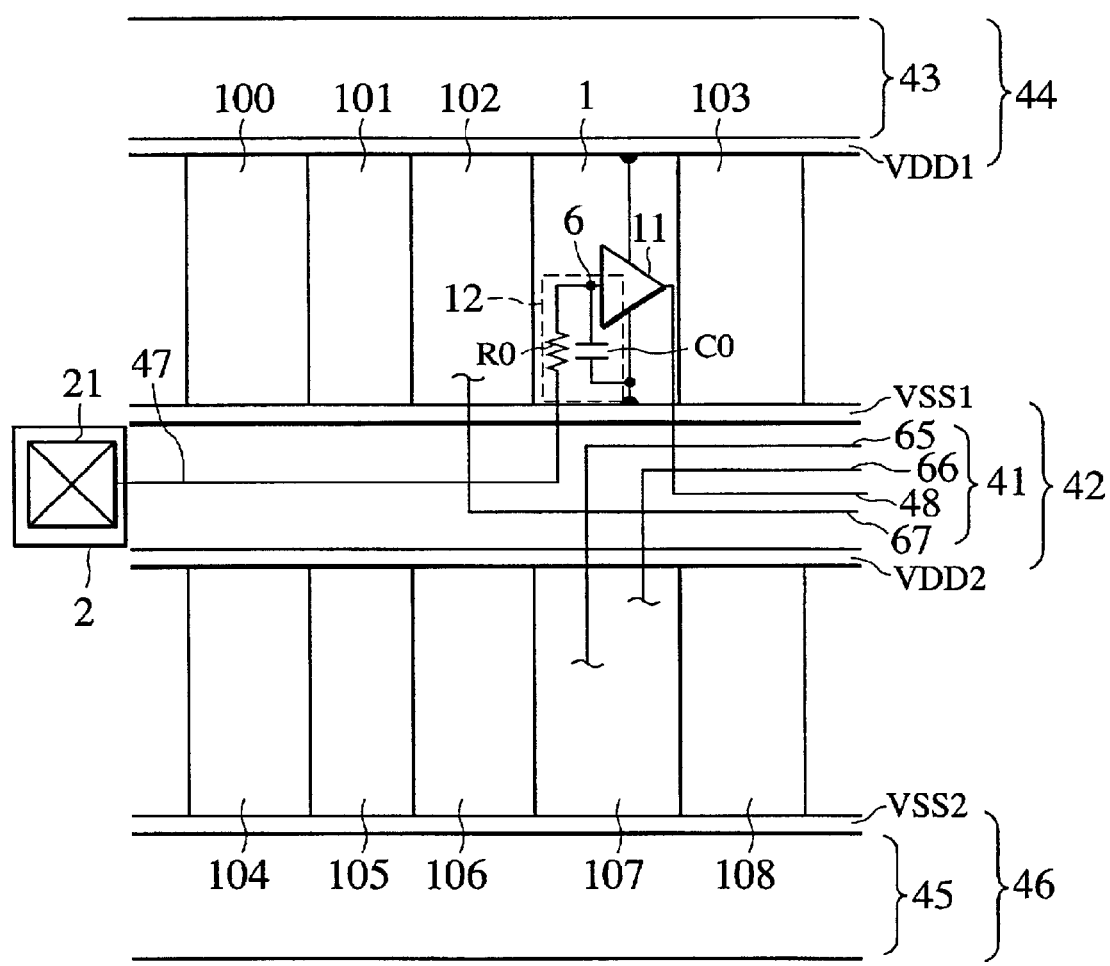
FIG. 3 is a diagram illustrating a noise cut filter for an EMS countermeasure, which is arranged in a logic cell, according to the semiconductor device of the first embodiment.

An enlarged view in the vicinity of the cell 1 of the semiconductor device shown in FIG. 2 is shown in FIG. 3. In a lateral direction of the cell 1, cells 100 to 103 are arranged. In one lengthwise direction of the cell 1, a VDD power supply wire VDD1 and the signal wiring area 43 are arranged. The wiring area 44 has the VDD power supply wire VDD1 and the signal wiring area 43. In the other lengthwise direction of the cell 1, the VSS power supply wire VSS1 and the signal wiring area 41 are arranged. In the signal wiring area 41, the signal wires 65 to 67 are arranged. Further, in this direction, the VDD power supply wire VDD2, the cells 104 to 108, and the VSS power supply wire VSS2 and the signal wiring area 45 are arranged. The signal wiring area 42 is configured by the VSS power supply wire VSS1, the signal wiring area 41 and the VDD power supply wire VDD2. A wiring area 46 is configured by the VSS power supply wire VSS2 and the signal wiring area 45.

The cell 1 has a buffer 11, to the input side of which a noise cut filter 12 as an EMS countermeasure is connected. The buffer 11 is connected to the power supply wire VDD1 and the power supply wire VSS1. The output side of the buffer 11 is connected to the signal wire 48. The signal wire 48 is extends from the cell 1 to the signal wiring area 41.

The filter 12 has a resistance R0 and a capacitor C0. One terminal of the capacitor C0 is connected to the input side of the buffer 11 and other terminal thereof is connected to the VSS power supply wire VSS1. One terminal of the resistance R0 is connected to the input side of the buffer 11 and other terminal thereof is connected to the signal wire 47. The signal wire 47 extends pulled out from the cell 1 to the signal wiring area 41. The wire 47 is connected to the I/O pad 21 of the I/O cell 2.

The semiconductor according to the first embodiment has a first power supply wire VSS1 capable of being set to a first electric potential VSS and a second power supply wire VDD1 capable of being set to a second electric potential VDD, which is different from this first electric potential VSS. The buffer circuit 11 as a functional circuit and the filter 12 are disposed between the first power supply wire VSS1 and the second power supply wire VDD1. The buffer circuit 11 is connected to the first power supply wire VSS1 and the second power supply wire VDD1. Since another functional circuit is not connected between the buffer circuit 11 and the I/O pad 21, the filter 12 transmits a signal, which is inputted or outputted between the exterior of the semiconductor device and the buffer circuit 11. The filter 12 has the capacitor C0. The capacitor C0 is disposed between the first power supply wire VSS1 and the second power supply wire VDD1. One end of the capacitor C0 is connected to the buffer circuit 11 and other end of the capacitor C0 is connected to the first power supply wire VSS1. The filter 12 has the resistance R0. The resistance R0 transmits a signal, which is inputted or outputted between the exterior of the semiconductor device and the buffer circuit 11. The resistance R0 is connected to the I/O pad 21 capable of inputting or outputting a signal with respect to the exterior of the semiconductor device. The resistance R0 is disposed between the first power supply wire VSS1 and the second power supply wire VDD1.

The cell 1 has the filter 12, making it possible to dispose the filter 12 in close vicinity to the buffer 11. Additionally, this close disposal of the filter 12 and the buffer 11 is not depended on the disposal of the signal wires 65 to 67 in the signal wiring area 41. If the filter 12 is disposed in close vicinity to the buffer 11, it is possible to enhance the effect of the EMS countermeasure. Particularly, it has been found that the effect of the EMS countermeasure is enhanced by connecting the power supply wire and a grounding conductor of the buffer 11 and the power supply wire and a grounding conductor of the filter 12 to make a common wire. According to the first embodiment shown in FIG. 3, the capacitor C0 of the filter 12 is directly connected to the power supply wire of the buffer 11 to be connected to the first power supply wire VSS1. Therefore, the power supply wires of the buffer 11 and the filter 12 are used in common. In other words, the point where the buffer 11 is connected to the first power supply wire VSS1 is identical with the point where the filter 12 is connected to the first power supply wire VSS1.

There are cases where the signal wires 65 to 67 are densely wired in the signal wiring areas 41 and 43 in the periphery of the cell 1 to be provided with the EMS countermeasure. In such case, as shown in FIG. 1, conventionally, the filter B was disposed separated from the signal wires 65 to 67, so that the point where the filter 11 was connected to the first power supply wire VSS1 was not identical with the point where the filter B was connected to the first power supply wire VSS1 but they were separated from each other. If the user intends to secure the area in which the filter B is disposed in order to bring these points into line, the relevant area of the semiconductor integrated circuit increases and the chip size is also increased. According to the first embodiment, upon layout of the semiconductor integrated circuit, as shown in FIG. 3, the filter 12 is disposed in the interior of the cell 1 in advance. Accordingly, it is not necessary to newly secure the area in which the filter 12 is disposed.

Semiconductor Integrated Circuit

Figure 4:
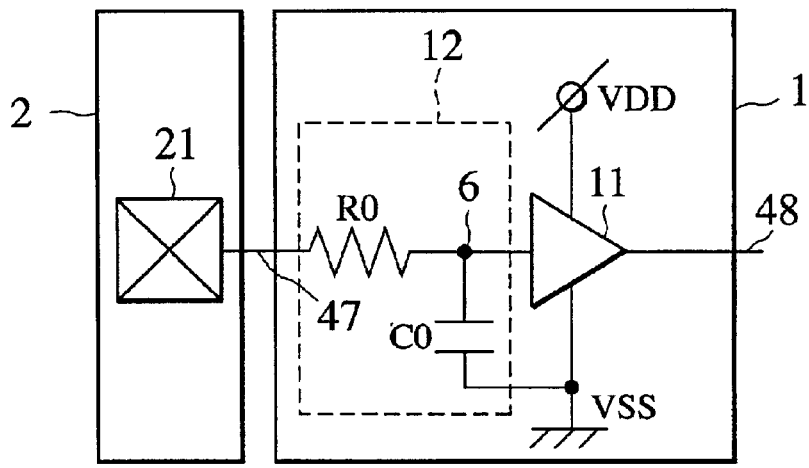
FIG. 4 is a circuit diagram illustrating the configuration of a semiconductor integrated circuit according to the first embodiment.

As shown in FIG. 4, the semiconductor integrated circuit according to the first embodiment has the semiconductor integrated circuit cell 1 and the I/O cell 2. The semiconductor integrated circuit cell 1 includes a circuit having the original function of this cell 1, for example, a circuit 11 such as a buffer or the like, with a filter 12 having the input resistance R0 and a capacitor C0. The input resistance R0 is connected between the input side of the cell 1 and the input side of the circuit 11. The capacitor C0 is connected between the input side of the circuit 11 and the VSS power supply wire. The I/O cell 2 has the I/O pad 21. The I/O pad 21 is capable of being electrically connected to the external device and the appliance or the like. The I/O pad 21 is capable of inputting an electric signal from the external device and the appliance and is capable of outputting the electric signal to the external device and the appliance. The I/O pad 21 is connected to the signal wire 47. The signal wire 47 is connected to the input side of the cell 1.

As shown in FIG. 3, the semiconductor integrated circuit according to the first embodiment has the first power supply wire VSS1 capable of being set to the first electric potential VSS and the second power supply wire VDD1 capable of being set to the second electric potential VDD, which is different from this first electric potential VSS. Further, the buffer circuit 11 as a functional circuit is disposed between the first power supply wire VSS1 and the second power supply wire VDD1. The buffer circuit 11 is connected to the first power supply wire VSS1 and the second power supply wire VDD1. Since no other functional circuit is connected between the buffer circuit 11 and the I/O pad 21, the buffer circuit 11 has a terminal 6 capable of inputting or outputting a signal with respect to the external of the semiconductor integrated circuit. The capacitor C0 is disposed between the first power supply wire VSS1 and the second power supply wire VDD1. One end of the capacitor C0 is connected to this terminal 6 and other end of the capacitor C0 is connected to the first power supply wire VSS1. The resistance R0 is connected to this terminal 6. Then, the resistance R0 transmits a signal, which is inputted or outputted with respect to the exterior of the semiconductor device. The resistance R0 is connected to the I/O pad 21 capable of inputting or outputting a signal with respect to the exterior of the semiconductor device. The resistance R0 is disposed between the first power supply wire VSS1 and the second power supply wire VDD1.

Thus, the cell 1 is arranged and connected to the next stage of the I/O cell 2. At the input side of the buffer 11, the noise cut filter 12 is formed. By this filter 12, noise intruding from the I/O 21 is removed, so that only a signal from the I/O pad 21 is inputted to the buffer 11. Further, a filter, particularly a capacitor, is always disposed in close vicinity to a logic, the object of the EMS countermeasure, so that it is possible to have the noise removing effect in any case. Furthermore, since the noise cut filter 12 for the EMS countermeasure is incorporated into the cell 1, the areas of the semiconductor integrated circuit, the semiconductor device and the semiconductor chip are not increased.

Figure 5:
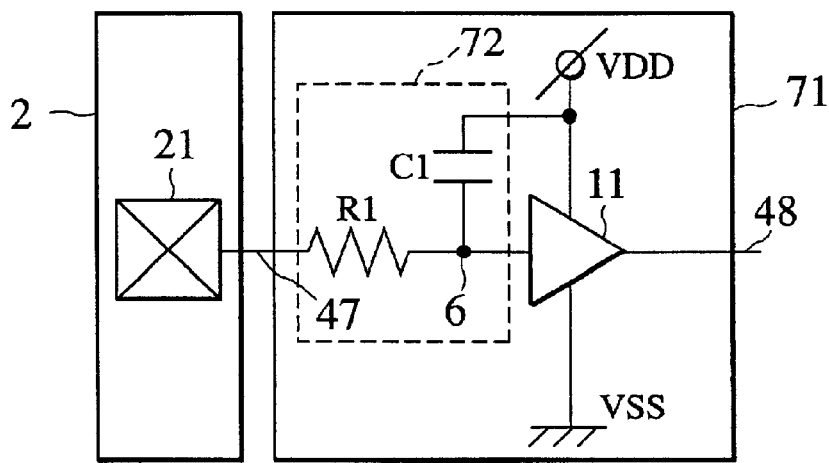
FIG. 5 is a circuit diagram illustrating the configuration of a semiconductor integrated circuit according to a modified first embodiment of the first embodiment.

As shown in FIG. 5, the semiconductor integrated circuit according to the modified first embodiment has a semiconductor integrated circuit cell 71 and the I/O cell 2. The cell 71 has a noise cut filter 72 for the EMS countermeasure. The filter 72 also has a resistance R1 and a capacitor C1 as same as the filter 12. The capacitor C1 is connected between the input of the buffer 11 and the VDD power supply wire. The semiconductor integrated circuit according to the first embodiment is different from the semiconductor integrated circuit according to the modified first embodiment in that the capacitor C0 of the filter 12 is connected to the VSS power supply wire and the capacitor C1 of the filter 72 is connected to the VDD power supply wire. Owing to this difference, the fixed electric potentials of the filter 12 and the filter 72 are different. The filter 12 and the filter 72 have the same noise cut functions as the EMS countermeasure function.

Figure 6:
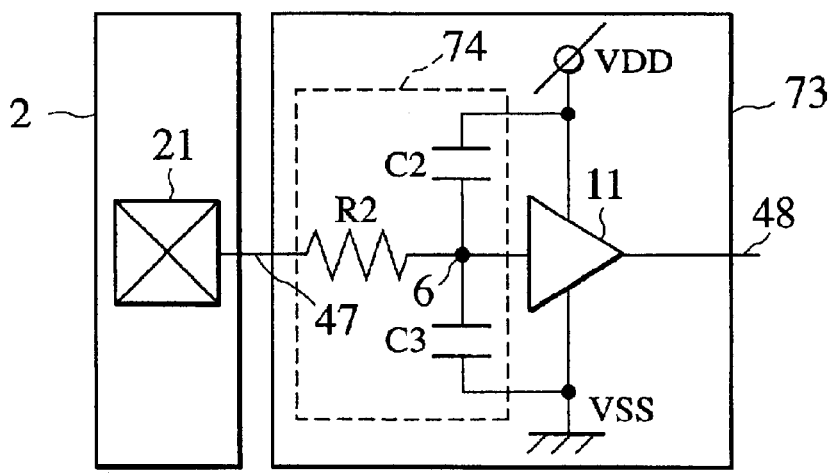
FIG. 6 is a circuit diagram illustrating the configuration of a semiconductor integrated circuit according to a modified second embodiment of the first embodiment.

As shown in FIG. 6, the semiconductor integrated circuit shown in the modified second embodiment has a semiconductor integrated circuit cell 73 and the I/O cell 2. The cell 73 has a noise cut filter 74 as the EMS countermeasure. The filter 74 also has an input resistance R2 and capacitors C2 and C3, the same as the filters 12 and 72. The capacitor C2 is connected between the input of the buffer 11 and the VDD power supply wire. The capacitor C3 is connected between the input of the buffer 11 and the VSS power supply wire. The semiconductor integrated circuit of the first embodiment is different from the semiconductor integrated circuit of the modified second embodiment in that the capacitor C0 of the filter 12 is connected to the VSS power supply wire, the capacitor C3 of the filter 74 is connected to the VSS power supply wire and the capacitor C2 is connected to the VDD power supply wire. Owing to this difference, although the fixed electric potential of the filter 12 is a VSS electric potential, the fixed electric potential of the filter 74 also copes with either VSS electric potential or VDD electric potential.

Figure 7:
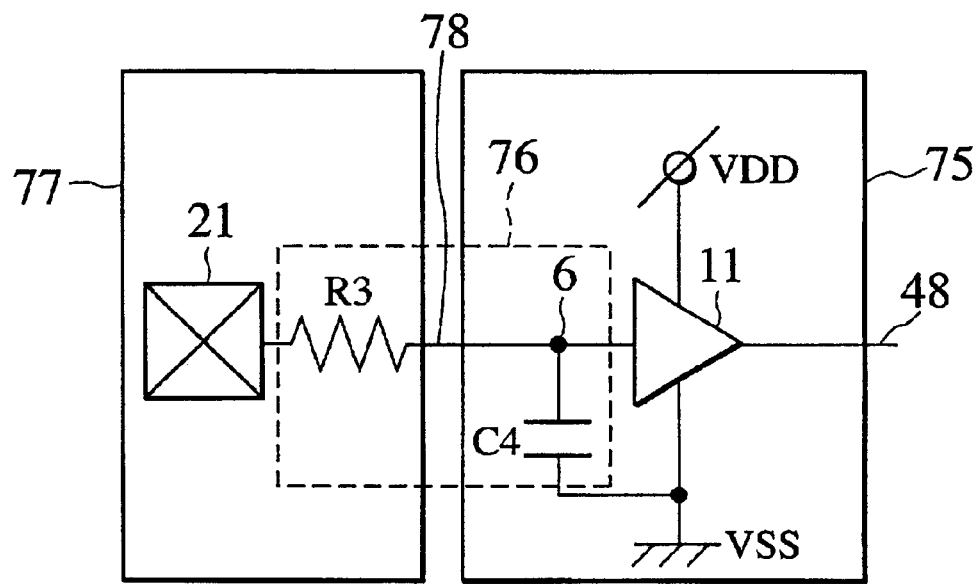
FIG. 7 is a circuit diagram illustrating the configuration of a semiconductor integrated circuit according to a modified third embodiment of the first embodiment.

As shown in FIG. 7, the semiconductor integrated circuit according to the modified third embodiment has a semiconductor integrated circuit 75 and an I/O cell 77. The semiconductor integrated circuit 75 has a capacitor C4. The capacitor C4 is connected between the input of the buffer 11 and the VSS power supply wire. The capacitor C4 does not function as a filter for the EMS countermeasure by itself.

The I/O cell 77 has the I/O pad 21 and a resistance R3 for protecting from electrostatic destruction (ESD). The I/O pad 21 is connected to the resistance R3 and the resistance R3 is connected to a signal wire 78. The signal wire 78 is connected to the input side of the buffer 11 of the cell 75. In other words, the I/O cell 77 is disposed in the former position of the cell 75. Therefore, owing to the resistance R3 and the capacitor C4, a noise cut filter 76 as an EMS countermeasure is formed. The noise intruding from the I/O pad 21 is eliminated.

Figure 8:
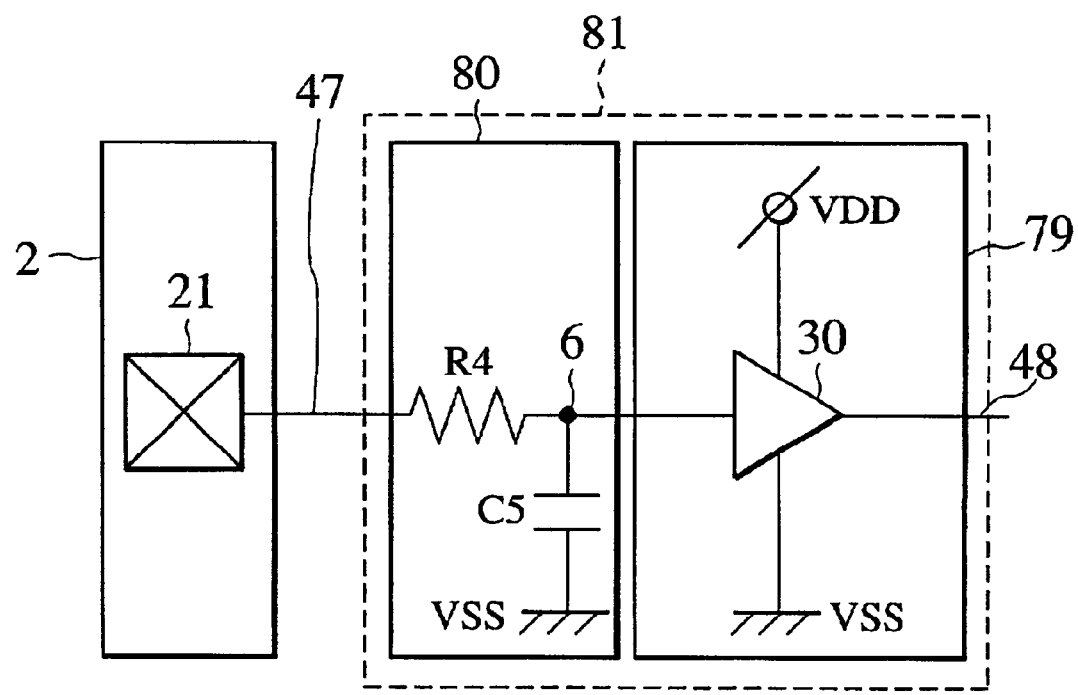
FIG. 8 is a circuit diagram illustrating the configuration of a semiconductor integrated circuit according to a modified fourth embodiment of the first embodiment.

As shown in FIG. 8, the semiconductor integrated circuit according to a modified fourth embodiment has a semiconductor integrated circuit 79, a cell 80 having a noise cut filter for the EMS countermeasure and the I/O cell 2. The cells 79 and 80 are adjacently disposed. The cells 79 and 80 are regarded as a single cell 81 and they are automatically wired upon architecture. The cell 79 has a buffer 30. The cell 80 has a resistance R4 and a capacitor C5. One end of the resistance R4 is connected to the input side of the buffer 30 and other end thereof is connected to the input side of the cell 80. One end of the capacitor C5 is connected to the input side of the buffer 30 and other end thereof is connected to the VSS power supply wire. The I/O cell 2 has the I/O pad 21. The I/O pad 21 is connected to a signal wire 47. The signal wire 47 is connected to the input side of the cell 80. Therefore, the noise intruding from the I/O pad 21 is eliminated.

Since the cell 81 has the filter cell 80, it is possible to dispose the filter cell 80 and the buffer 30 adjacently. Owing that the filter cell 80 is disposed adjacent to the buffer 30, it is possible to enhance the effect of the EMS countermeasure. However, the power supply wire of the buffer 30 and the filter cell 80 is not a common wire. In other words, although the point where the buffer 30 is connected to the power supply electric potential VSS is not identical with the point where the filter cell 80 is connected to the power supply electric potential VSS, the buffer 30 and the filter cell 80 are disposed, being separated by a certain distance. Therefore, it is possible to stably obtain the desired EMS effect.

Architecture Device of a Semiconductor Device

An architecture device of a semiconductor device has an operation unit 82, an input/output unit 87 and a standard cell library recording unit 88 having a cell with an EMS countermeasure circuit. The operation unit 82, the input/output unit 87 and the standard cell library recording unit 88 are connected to each other by a bus 86 and making it possible to send and receive an electric signal.

The operation unit 82 has a logical expression forming unit 83, a logic synthesis unit 84 to synthesize logic using a cell having an EMS countermeasure circuit and an automatic arranging and wiring unit 85.

The logical expression-forming unit 83 describes a specification of this semiconductor device in logical expressions. In the recording unit 88, a cell, in which the EMS countermeasure circuit is incorporated, is registered and a cell library capable of searching for and reading the cell is recorded. The logic synthesis unit 84 forms a network list with the present cell as the basis of the present logical expression. The automatic arranging and wiring unit 85 forms a layout pattern of the present semiconductor device on the basis of the present network list.

Manufacturing Method of a Semiconductor Device

Figure 9:
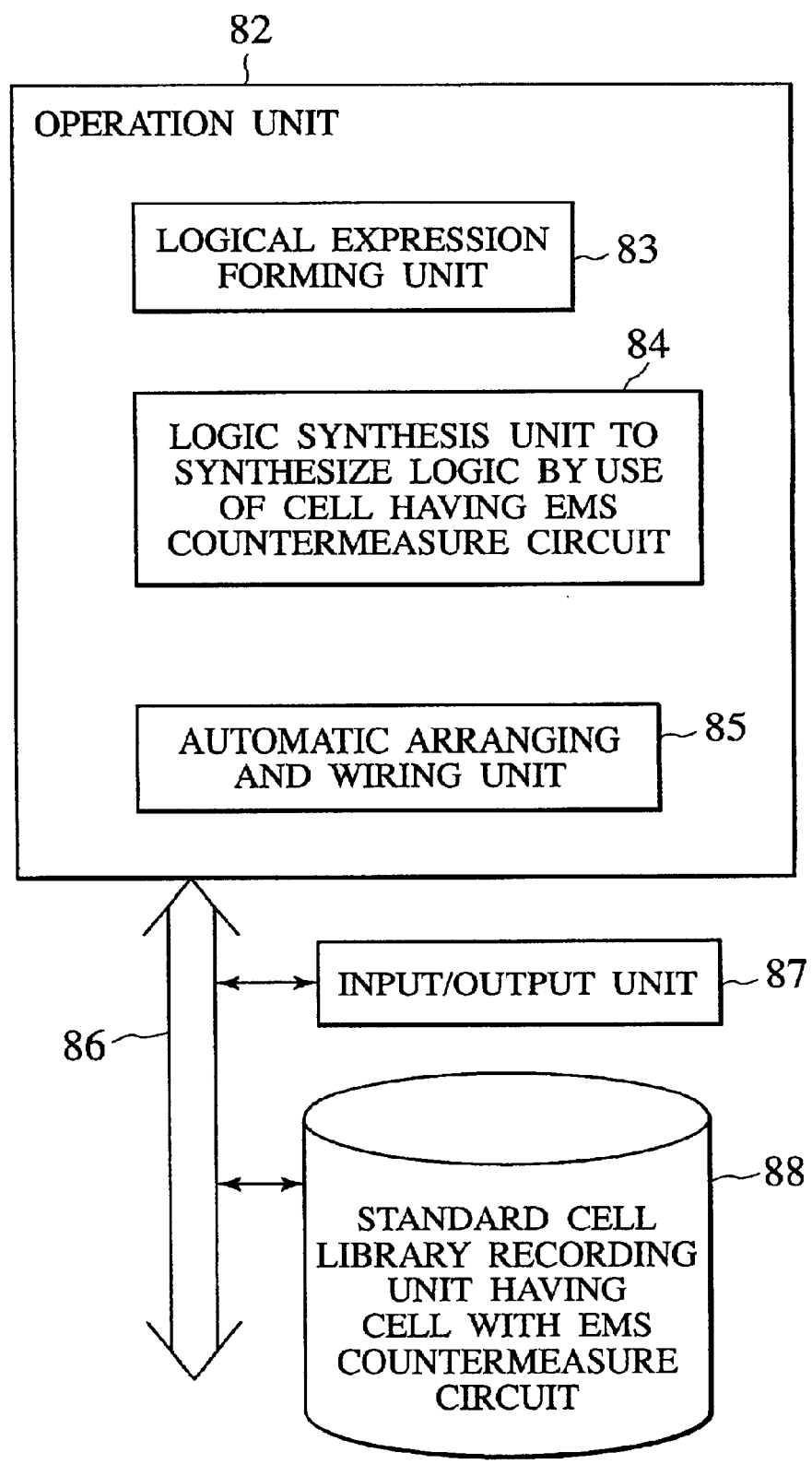
FIG. 9 is a block diagram of an architecture device of the semiconductor integrated circuit according to the first embodiment.
Figure 10:
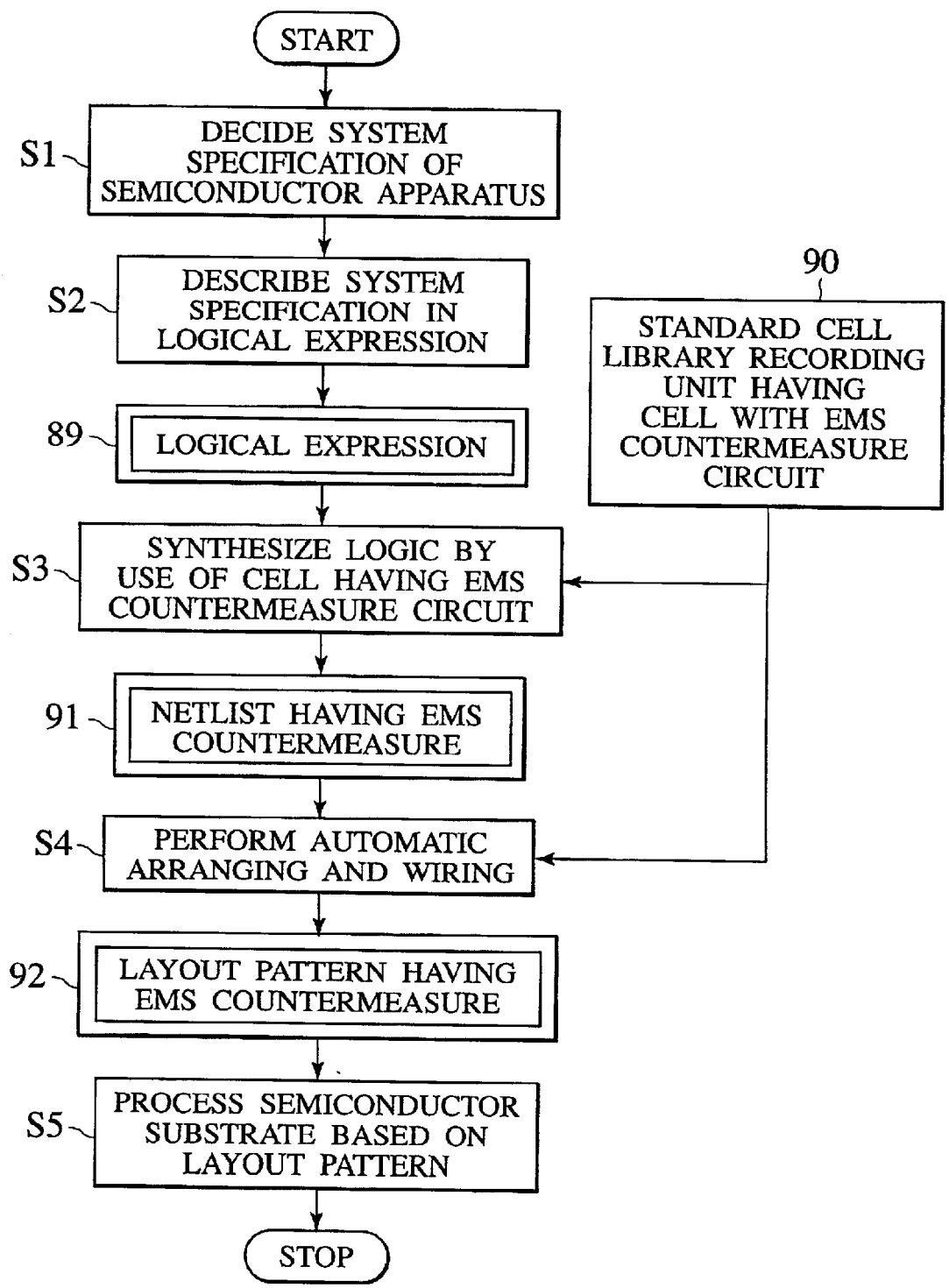
FIG. 10 is a flow chart of a manufacturing method of the semiconductor integrated circuit according to the first embodiment.

FIG. 10 is a flow chart of the manufacturing method of a semiconductor device, whereby a semiconductor device is manufactured using the architecture device of the semiconductor device shown in FIG. 9. The manufacturing method of the semiconductor device comprises architecturing the semiconductor device, i.e., making the layout pattern of the semiconductor device and processing the semiconductor substrate. First, the architectural method of the semiconductor device will be explained up until the manufacture of the layout pattern.

First, in step S1, the system specifications of the semiconductor device are determined.

Next, according to step S2, in the logical expression-forming unit 83 shown in FIG. 9, the ascertained system specification is described as logical expression 89.

According to step S3, in the logical expression-forming unit 84 shown in FIG. 9, a network list of the logic function, with the standard cell as a unit is formed. On the basis of logical expression 89, a network list 91 with cell 1, into which EMS countermeasure circuit 12 is incorporated, is formed. Cell 1, in which the EMS countermeasure circuit 12 is incorporated, is registered in a cell library 90. The system described in logical expression 89 is converted into a connection of cells, which is included in the standard cell library 90 with the EMS countermeasure circuit 12 incorporated cell 1, recorded in a recording unit 88. This connection of the cells is made into a network list 91, which is provided with the EMS countermeasure. Upon converting the cells, on the basis of the function of a cell included in the cell library 90 and the timing of the transmission of a signal, which is calculated from resistance and capacity, or the like, a suitable cell is selected. Particularly, a cell is selected based on whether the EMS countermeasure is needed or not as a function of the cell.

After that, in step S4, using the automatic arranging and wiring unit 85 shown in FIG. 9, a real layout pattern 92 is generated. On the basis of the network list 91, the layout pattern 92 of the present semiconductor device is formed. Referring to the cells included in the standard cell library 90, and with consideration of their size cells in the network list 91 are disposed in areas assumed to have a semiconductor substrate or a photograph mask. Then, with wiring placed between the disposed cells, the layout pattern 92 is completed.

Subsequently, in step S5, on the basis of the manufactured layout pattern 92, the semiconductor substrate is processed and the semiconductor device is manufactured.

Figure 11:
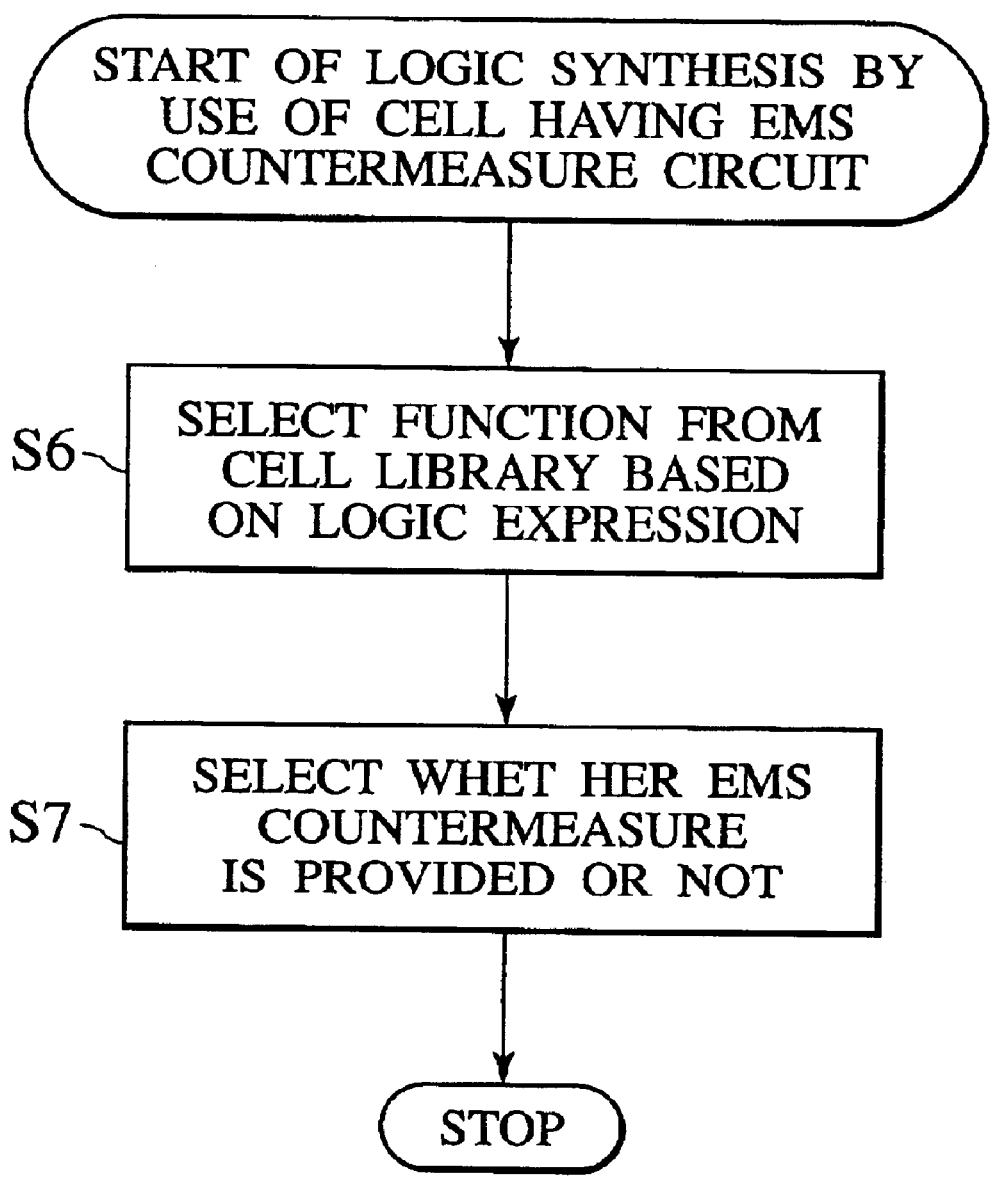
FIG. 11 is a flow chart of logic synthesis using a cell having an EMS countermeasure circuit according to the first embodiment.

Further, the details of the logic synthesis in step S3 are shown in the flow chart of FIG. 11. At first, in the step S6, on the basis of the logical expression 89, from functions excluding the EMS countermeasure of the cell library 90, a function required to manufacture the network list 91 is selected. Next, in step S7, it is determined whether the selected function should be provided with the EMS countermeasure or not. In other words, it is determined whether the selected cell further requires the EMS countermeasure or not. Thus, a cell necessary for manufacturing the network list 91 is selected from the cell library 90. Furthermore, determining whether the cell 1 requires the EMS countermeasure or not denotes determining whether the cell 1 is connected to the I/O pad 21 or not.

FIG. 12 is a data constitutional view of a standard cell library 90 having a cell with an EMS countermeasure circuit. The data configuration has a function of a cell and an area 93 capable of searching electric current driving capability. Moreover, the data configuration has an area 94, in which the information of a cell without an EMS countermeasure is recorded, and an area 95, in which the information of a cell with an EMS countermeasure is recorded. The functions of the cells in the area 94 are correlated with the information of the cells in the area 94 and the area 95 for each cell. According to this data configuration, it is possible to record a cell by function, capability and whether an EMS countermeasure is provided or not. It is possible to select the cell by designating the function, the capability and whether an EMS countermeasure should be provided or not. In such a case, a function may be a buffer function, a basic function such as NOT and NAND or the like, a memory function or a function requiring a large size circuit such as a CPU function or the like. In a case of treating the memory function and the CPU function, a cell is replaced with a block. For example, the cell of buffer 1 shown in FIG. 12 is equivalent to the cell 79 shown in FIG. 8 and the cell in the buffer 11 is equivalent to the cell 1 shown in FIG. 4.

Filter 12 for the EMS countermeasure is incorporated in the cell 1 to form the noise cut filter 12 incorporated cell 1 for this EMS countermeasure. This noise cut filter 12 incorporated cell 1 is put in the cell library 90. Upon architecture of a semiconductor device such as a cell base LSI or the like, if there is a logic circuit, which should be provided with the EMS countermeasure, the logic cell 1, which has the filter 12 for the EMS countermeasure, can be selected from the cell library 90 and automatically arranged and wired within the cell base architectural area. Accordingly, if the architect does not need to manually arrange and wire a circuit for an EMS countermeasure, it is possible to automatically arrange and wire the circuit for the EMS countermeasure. Therefore, it is possible to improve architecture efficiency remarkably.

For example, as shown in FIG. 3, by automatically arranging and wiring the logic cells 100 to 108 in a cell base architectural area in order, a logic cell row is formed. In such a case, if there is a cell 1 to be provided with the EMS countermeasure, the cell 1, which has the EMS countermeasure circuit 12, is selected from the cell library 90 to be automatically arranged and wired as a logic cell within the cell base architectural area.

Embodiment 2

Figure 13:
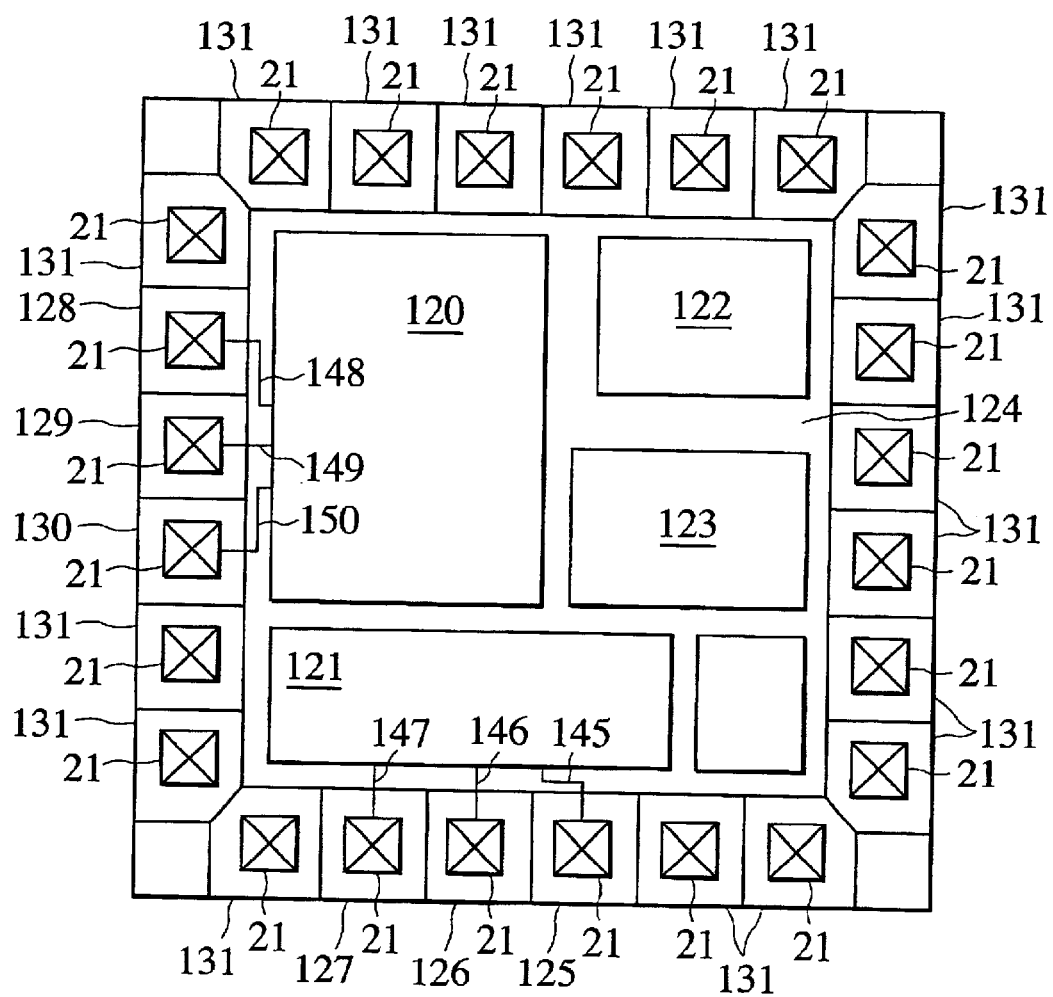
FIG. 13 is a top view of a semiconductor device according to a second embodiment.

According to the second embodiment, as shown in FIG. 13, a semiconductor device has a plurality of I/O cells 131 or the like and a block 120 or the like, will be explained below. In the semiconductor device according to the second embodiment, I/O cells 125 to 131 are disposed on its peripheral portion. In the interior of the semiconductor device, blocks 120 to 123 having different sizes and different functions are disposed. A wiring area 124 is provided on the outside of the blocks 120 to 123, being enclosed by the I/O cells 125 to 131. The I/O cells 125 to 131 have the I/O pad 21.

A signal wire 145 is connected between the I/O pad 21 of the I/O cell 125 and a block 121. A signal wire 146 is connected between the I/O pad 21 of the I/O cell 126 and a block 121. A signal wire 147 is connected between the I/O pad 21 of the I/O cell 127 and a block 121. A signal wire 148 is connected between the I/O pad 21 of the I/O cell 128 and a block 120. A signal wire 149 is connected between the I/O pad 21 of the I/O cell 129 and a block 120. A signal wire 150 is connected between the I/O pad 21 of the I/O cell 130 and a block 120. The signal wires 145 to 150 are arranged in the wiring area 124.

Figure 14:
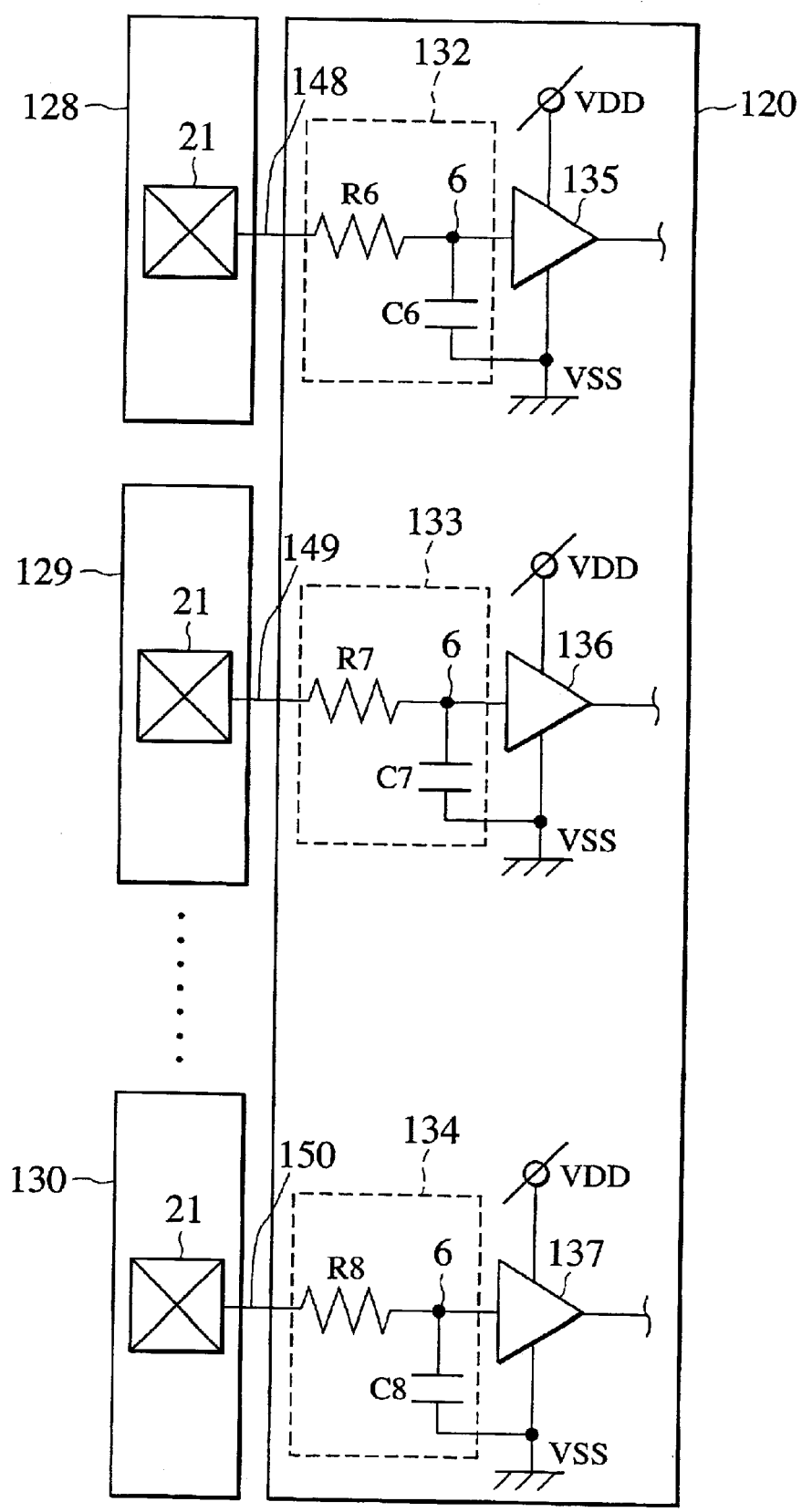
FIG. 14 is a diagram illustrating a noise cut filter for an EMS countermeasure, which is arranged in a logic cell according to the semiconductor device of the second embodiment.

As shown in FIG. 14, the semiconductor integrated circuit according to the second embodiment has the semiconductor integrated circuit block 120 and the I/O cells 128 to 130. In the semiconductor integrated circuit block 120, a circuit with the original function of this block 120, for example, circuit 135 to 137 such as a buffer and filters 132 to 134, which are provided on the former stages of the circuits 135 to 137 and are configured by input resistances R6 to R8 and capacitors C6 to C8, are included. The input resistances R6 to R8 are connected between the input side of the block 120 and the input sides of the circuits 135 to 137. The capacitors C6 to C8 are connected between the input sides of the circuits 135 to 137 and the VSS power supply wire. The I/O cells 128 to 130 have the I/O pad 21. The I/O pad 21 of the I/O cell 128 is connected to the signal wire 148. The signal wire 148 is connected to the input side of the filter 132 as the input side of the block 120. The I/O pad 21 of the I/O cell 129 is connected to the signal wire 149. The signal wire 149 is connected to the input side of the filter 133 as the input side of the block 120. The I/O pad 21 of the I/O cell 130 is connected to a signal wire 130. The signal wire 130 is connected to the input side of the filter 134 as the input side of the block 120.

Thus, the block 120 is disposed and connected on the next stages of the I/O cells 128 to 130. The noise cut filters 132 to 134 are formed at the input side of the buffers 135 to 137. The noise intruding from the I/O pad 21 is eliminated by the filters 132 to 134, so that only the signal from the I/O pad 21 is inputted in the buffers 135 to 137. Further, a filter, particularly a capacitor, is always disposed in close vicinity to a logic, which is an object of the EMS countermeasure, so that it is possible to have the noise elimination effect in any situation. Alternatively, since the noise cut filters 132 to 134 for the EMS countermeasure are incorporated in the block 120, the area of the semiconductor integrated circuit and the area of the semiconductor device and the semiconductor chip are not increased.

According to the second embodiment, a semiconductor integrated circuit cell, in which a buffer and a noise cut filter for an EMS countermeasure are provided as one set, is manufactured. Therefore, in the architecture of the cell base LSI, it becomes possible to automatically arrange and wire a logic cell, in which the EMS countermeasure circuit is incorporated in the cell base architectural area. In other words, the EMS countermeasure circuit is capable of being automatically arranged and wired, so that it is possible to improve the architecture and operating efficiency. Further, it is possible to closely dispose a buffer to be provided with the EMS countermeasure and a capacitor comprising a filter for the EMS countermeasure without effecting the size of a chip. Further, it is possible to securely prevent malfunction of the internal circuit owing to input from outside noise.

Additionally, according to the embodiments, a buffer is taken as an example of a circuit, which is provided with an EMS countermeasure. However, the present invention is not limited to this and a logic circuit or the like and other circuits are available so as to obtain the same effect as the buffer.

Various modifications will become possible for those skilled in the art after receiving the teachings of the present disclosure without departing from the scope thereof.

What is claimed is:

1. A semiconductor integrated circuit comprising:
   a first power supply wire configured to have a first electric potential;
   a second power supply wire configured to have a second electric potential, different from the first electric potential; and
   a cell registered in a cell library, disposed between and adjacent to said first power supply wire and said second power supply wire, and having a functional circuit disposed in the cell and electrically connected to said first power supply wire and said second power supply wire and having a terminal configured to input a signal from outside of the semiconductor integrated circuit, and a first capacitor disposed in the cell and electrically connected at one end to the terminal and configured to have another end directly connected to a third power supply wire to be connected to the functional circuit and said first power supply wire.

2. The semiconductor integrated circuit according to claim 1, wherein the third power supply wire and a fourth power supply wire to be connected to the first capacitor and said first power supply wire are used in common, and a point where the functional circuit is connected to the first power supply wire is identical with a point where the first capacitor is connected to the first power supply wire.

3. The semiconductor integrated circuit according to claim 2, further comprising a second capacitor disposed in the cell, electrically connected at one end to the terminal and electrically connected at other end to said second power supply wire.

4. The semiconductor integrated circuit according to claim 1, further comprising a resistance electrically connected to the terminal and configured to transmit the signal.

5. The semiconductor integrated circuit according to claim 4, wherein said resistance is electrically connected to a pad configured to input the signal from the outside of the semiconductor integrated circuit.

6. The semiconductor intergrated circuit according to claim 4, wherein said resistance is disposed in the cell.

7. The semiconductor integrated circuit according to claim 4, wherein said first capacitor and said resistance serve as a filter.

8. The semiconductor integrated circuit according to claim 1, wherein said functional circuit comprises a buffer circuit.

9. A semiconductor device comprising:
   a first power supply wire configured to have a first electric potential;
   a second power supply wire configured to have a second electric potential, different from the first electric potential; and
   a cell registered in a cell library, disposed between and adjacent to said first power supply wire and said second power supply wire, and having a functional circuit disposed in the cell and electrically connected to said first power supply wire and said second power supply wire, and a filter disposed in the cell and configured to transmit a signal inputted from outside of the semiconductor device to said functional circuit and configured to have an end directly connected to a third power supply wire to be connected to the functional circuit and said first power supply wire.

10. The semiconductor device according to claim 9, wherein said filter comprises a first capacitor disposed in the cell and electrically connected at one end to said functional circuit.

11. The semiconductor device according to claim 10, wherein the third power supply wire and a fourth power supply wire to be connected to the first capacitor and said first power supply wire are used in common, and a point where the functional circuit is connected to the first power supply wire is identical with a point where the first capacitor is connected to the first power supply wire.

12. The semiconductor device according to claim 11, wherein said filter further comprises a second capacitor disposed in the cell, electrically connected at one end to said functional circuit and electrically connected at other end to said the second power supply wire.

13. The semiconductor device according to claim 9, wherein said filter comprises a resistance configured to transmit the signal.

14. The semiconductor device according to claim 13, wherein the resistance is electrically connected to a pad configured to input the signal form the outside of the semiconductor device.

15. The semiconductor device according to claim 13, wherein the resistance is disposed in the cell.

16. The semiconductor device according to claim 9, wherein said functional circuit comprises a buffer circuit.

* * * * *